(12) United States Patent
Ahn et al.

(10) Patent No.: US 7,319,635 B2
(45) Date of Patent: Jan. 15, 2008

(54) MEMORY SYSTEM WITH REGISTERED MEMORY MODULE AND CONTROL METHOD

(75) Inventors: Young-Man Ahn, Yongin-si (KR); Seung-Jin Seo, Suwon-si (KR); Seung-Hee Mun, Yongin-si (KR); Jong-Cheol Seo, Yongin-si (KR); Jung-Kuk Lee, Yongin-si (KR); Soon-Deok Jang, Yongin-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 146 days.

(21) Appl. No.: 11/254,696

(22) Filed: Oct. 21, 2005

(65) Prior Publication Data

US 2006/0280024 A1 Dec. 14, 2006

(30) Foreign Application Priority Data

Jun. 9, 2005 (KR) .................. 10-2005-0049441

(51) Int. Cl.
*G11C 8/00* (2006.01)
(52) U.S. Cl. .................. 365/233; 365/236; 365/194
(58) Field of Classification Search ................ 365/233, 365/236, 230.06, 230.08, 191, 194; 713/401
See application file for complete search history.

(56) References Cited

U.S. PATENT DOCUMENTS

| 5,991,231 | A | * | 11/1999 | Koshikawa | ................. 365/233 |
| 6,754,112 | B2 | | 6/2004 | Alun et al. | |
| 7,051,225 | B2 | * | 5/2006 | Nishio et al. | ............... 713/401 |
| 7,113,446 | B2 | * | 9/2006 | Fujisawa | .................... 365/233 |
| 2003/0221044 | A1 | | 11/2003 | Nishio et al. | |
| 2006/0044927 | A1 | * | 3/2006 | Han et al. | ................... 365/232 |
| 2007/0086269 | A1 | * | 4/2007 | Lee | ............................ 365/233 |

FOREIGN PATENT DOCUMENTS

JP          2006-344216 A   *  12/2006

\* cited by examiner

*Primary Examiner*—Gene N. Auduong
(74) *Attorney, Agent, or Firm*—Volentine & Whitt, PLLC

(57) ABSTRACT

A memory module and related method are disclosed. The memory module comprises a clock generator configured to generate first and second internal clock signals in relation to an external clock signal, and a register configured to receive the first and second internal clock signals. The register stores an external control/address signal in response to the first internal clock signal and transmits an internal control/address signal derived from the external control/address in response to the second internal control/address signal.

33 Claims, 12 Drawing Sheets

MEMORY SYSTEM WITH REGISTERED MEMORY MODULE AND CONTROL METHOD

BACKGROUND OF THE INVENTION

1. Field of the Invention

Embodiments of the present invention relate generally to memory systems and memory modules. More particularly, embodiments of the invention relate to registered memory modules adapted to operate at multiple operating frequencies, and yet maintain appropriate setup and hold times for control/address signals regardless of operating frequency.

2. Description of the Related Art

Conventional host systems, such as servers, personal computers (PCs), notebook PCs, and Personal Digital Assistants (PDAs) often include a plurality of memory devices operationally grouped together in one or more memory modules. Memory modules are typically implemented on a small printed circuit board (PCB) (e.g., a daughterboard) adapted for mechanical and electrical connection with a larger PCB (e.g., a motherboard) via a corresponding plurality of slot connectors.

Figure (FIG.) 1 shows a general arrangement of memory modules (MM0 through MMn) on a motherboard with a corresponding chipset. The term "chipset" is used throughout this description to denote a collection of conventionally understood clock, control, and/or drive circuitry. This circuitry may be implemented in a single integrated circuit package (i.e., a "chip"), or in a family of related chips. This circuitry may take many different forms. A chipset may include, for example, a memory controller, a bus re-drive circuit, a phase-lock or delay-lock loop circuit, power circuitry, and/or a clock generator or clock buffer circuit. At a minimum, however, the term chipset subsumes at least the circuitry providing an external clock signal (ECLK) to the memory modules and the various control/address (C/A) signals conventionally applicable to memory devices mounted on the memory modules.

In practical implementation, the external clock signal and potentially some or all of the control/address signals applied to the memory modules may be respective differential signals. The use of differential signaling within memory systems incorporating memory modules is well understood, and as such this particular design option will not be discussed in detail, nor will the drawings be cluttered with multiple differential signal illustrations. Rather, it is understood that the general descriptions of exemplary clock and control/address/data signals that follow may suggest the use of one or more differential signals, as the memory system designer deems appropriate.

In a similar vein, the generic use of control/address signals as well as data input/output (I/O) signals in conjunction with memory systems incorporating memory modules is also well understood. Those of ordinary skill in the art understand that the designation of address signals, address signal lines, control signals, control signal lines, data signals and/or data signal lines are separate matters of design choice. Address, control and/or data signals may be multiplexed on common signal lines and/or uniquely ascribed to one or more sets of dedicated signal lines. Data words, as defined by address signals and as provided by data signals may be defined by the system designer in any reasonable fashion.

Individual chip select (CS) signals are normally provided by the chipset to initiate or terminate one or more operations applied to a particular memory module. Each memory module typically comprises a plurality of memory devices (e.g., DRAM, SRAM, SDRAM, etc.). In early conventional implementations, DRAM-based memory modules used a stub-bus topology requiring that data signals from an associated memory controller be electrically connected to the data signal lines of every DRAM mounted on the memory module. This topology results in the use of very wide data buses.

However, as evolving server and PC designs have come to require greater and greater numbers of signal line connections and as the operating speed of memory systems incorporating memory modules has continued to increase, conventional connection architectures have proved unwieldy and the quality of data signals has become degraded due to problems with signal line impedance mismatching, noise, and reduced signal thresholds and swing voltages, etc. As a result, memory system designers have previously faced a choice between limiting memory density to reduce data errors at high operating speeds or accepting slower operating speeds to achieve high data density.

To avoid this difficult choice, memory system designers have developed alternative memory architectures to replace the stub-bus topology. A common approach used by many of these alternative memory architectures is to provide a register (also called a buffer) between each of memory module and the chipset (incorporating e.g., a memory controller). The register reduces electrical loads on the chipset to improve the integrity of associated data signals, and it also allows each memory module to send and receive data in a point-to-point fashion. In other words, the constituent register allows serial communication between the memory module and the chipset.

Serial communication may be realized, for example, through packet based transmissions between the chipset and the respective registers incorporated in memory modules within the memory system. Various conventionally understood routing or switching mechanisms and methods may be used to create, send, and/or receive the packets.

In addition to reducing distortion and noise on the data signals sent and received by the chipset, the registers also reduce the pin count (e.g., signal line connections) requirement for the memory system and allow higher transmission rates between the chipset and the respective memory modules.

FIG. 2 shows a memory architecture wherein each memory module includes a register adapted to send and receive at least a plurality of control/address (C/A) signals to/from a chipset and a plurality of memory modules MM0 through MMn. An external clock signal (ECLK) is provided by the chipset to each memory module, and data signals are transferred to/from the chipset and the plurality of memory modules via one or more data bus(es). Generally speaking, each memory module uses the control/address (C/A) signals to access its constituent memory devices in order to store (i.e., write) or retrieve (i.e., read) data.

A number of existing memory architectures incorporate registers into memory modules. These include Fully Buffered Dual In-line Memory Modules (FBDIMM), Registered Dual In-line Memory Modules (RDIMM), and Registered In-line Memory Modules (RIMM), to name but a few. Collectively, this class of memory architectures wherein at least one memory module comprises a register adapted to communicate with a chipset is generically referred to hereafter as "registered memories". Similarly, a memory module comprising such a register will hereafter be generically referred to as a "registered memory module".

FIG. 3 is a diagram showing a memory module 302 in a conventional registered memory system 300. Referring to FIG. 3, memory module 302 comprises a phase-lock loop circuit 303 receiving an external clock signal (ECLK) from a chipset 301, and generating first and second internal clock signals, (ICLK1 and ICLK2), in synchronization with the external clock signal. Of note, in certain embodiments, ICLK1 may comprise a plurality of internal clocks, each configured for respective application to one of a plurality of memory devices 305. Memory module 302 further comprises a register 304 receiving external control/address signals (EC/A) from chipset 301 and the second internal clock signal and producing an internal control/address signals (IC/A) in response to the second internal clock signal. Memory module 302 still further comprises the plurality of memory devices 305 receiving the internal control/address signals and first internal clock signal, and transferring data to/from chipset 301 via a data bus in accordance with the internal control/address signals and the first internal clock signal.

For memory module 302 to function properly, the external clock signal, first internal clock signal, and second internal clock signal should have the same phase when respectively sampled at phase-lock loop circuit 303, one or more of memory devices 305, and register 304 (e.g., at points P1, P2, and P3 shown in FIG. 3). Accordingly, a signal line L1 carrying the first internal clock signal and a signal line L2 carrying the internal clock signal should have substantially the same delay characteristics (i.e., should provide the same signal flight time).

The internal control/address signals should arrive at each one of the memory devices 305 at substantially the same time. In other words, any one of memory devices 305 should not receive the internal control/address signal before another one of the memory devices 305. One way to ensure that this happens is to arrange a signal line L3 connecting register 304 to memory devices 305 in an H-tree type of signal line topology. An exemplary H-tree topology is shown in FIG. 4. An H-tree topology comprises a hierarchical arrangement of signal lines allowing a signal to be distributed between a number of different destinations at roughly the same time. The H-tree topology also attempts to minimize transmission related distortion of the signal by balancing respective signal line impedances.

The internal control/address signals are periodically sampled by memory devices 305 at intervals determined by the first internal clock signal. In order to reliably sample the internal control/address signals, the setup and hold times of the internal control/address signals relative to the first internal clock signal should be large enough to ensure that internal control/address signals are stable when the sampling occurs. Here, the setup time is defined as an interval between a previous transition of the internal control/address signals and a sampling event, and the hold time is defined as an interval between the sampling event and a next transition of the internal control/address signals.

With the foregoing conventional examples in mind, the flow of control/address signals from chipset through register and on to individual memory devices will be considered in some additional detail.

Ideally, the setup and hold time periods for the internal control/address signals will be equal. That is, the setup time associated with the storing of the external control/address signals in the register and hold time during which the internal control/address signals are presented on a signal line bus connecting the register with the memory devices will be balanced and thus respectively equal to half the period of the external clock signal. This balanced relationship between setup and hold times allows the internal control/address signal to stabilize during half of the external clock cycle before being sampled by one or more of the memory devices. Where either the setup time or the hold time becomes too short relative to the frequency of the external clock signal, it becomes increasingly likely that the internal control/address signals will communicate erroneous (or unstable) control and/or address information to memory devices 305.

The stable maintenance of setup and hold time periods is further complicated by collateral performance expectations associated with contemporary memory systems. One such expectation is the provision of different operating frequencies within a memory system. In general, it is desirable that a memory system be able to operate at different frequencies so it may be used with processors or host devices operating at different frequencies.

Consider, as an example, the effect of changing the operating frequency on the control/address signaling dynamics of a typical conventional memory system. FIGS. 5 and 6 are waveform timing diagrams illustrating the operation of a conventional registered memory 300 at respective operating frequencies of 400 and 200 MHz. By comparing the waveforms shown in FIGS. 5 and 6, one may appreciate that effect that changing the operating frequency of a memory system has on the signaling dynamics of the constituent registered memory modules.

FIG. 5 illustrates operation of the exemplary memory system at 400 MHz, resulting in an external clock signal having a period of 2.5 ns. As the exemplary memory system is assumed to be optimized for 400 MHz operation, the resulting setup and hold times are 1.25 ns respectively.

Within FIG. 5, signal C/A_Rin shows the timing associated with the input of the external control/address (EC/A) signals to register 304. The external control/address signals are stored as signal C/A_Rin in register 304 on the rising edge of the second internal clock signal (ICLK2). Signal IC/A_Min shows the timing associated with the output of signal C/A_Rin from register 304 as internal control/address signals (IC/A) and the input of internal control/address signal to memory devices 305. Memory devices 305 sample signal IC/A_Min on the rising edge of the first internal clock signal (ICLK1).

Thus, a delay period (tpdf) is required for signal C/A_Rin to be output as the internal control/address signals and applied to memory devices 305. This delay period comprises one delay associated with the interval operation of register 304 (e.g., d_REG, or the time required to output the internal control/address signals after receiving signal C/A_Rin), and another delay associated with the signal flight time delay of signal line L3 (e.g., d_L3, or the signal flight time of the internal control/address signals from register 304 to memory devices 305).

As the exemplary memory system operation shown in FIG. 5 has been optimized to run at 400 MHz, the delay period is designed to be 1.25 ns, or half the period of the external clock signal. As a result, setup time "ts" and hold time "th" are also both equal to half a period of external clock signal. In the illustrated example, the delay period is set to 1.25 ns by setting the register delay (d_REG) of register 304 to 0.5 ns and setting the flight line delay of signal line L3 (d_L3) to 0.75 ns. Alternatively, register delay (d_REG) could be set to 0.75 ns and flight time L3 line delay (d_L3) could be set to 0.5 ns. Either way, delay period "tpdf" may be accurately established at the desired time of one half the period of the external clock (e.g., 1.25 ns).

However, the operation of the exemplary system illustrated in FIG. 5 is next assumed to undergo a change in operating frequency from 400 MHz to 200 MHz. The results of this change are illustrated in FIG. 6. As can be seen in FIG. 6, the established delay period (tpdf) remains set at 1.25 ns. As a result, the setup time (ts) becomes 3.75 ns and hold time (th) remains 1.25 ns. Since hold time is very short relative to the operating frequency of the memory system, as defined by the external clock signal, it is possible that one or more of the memory devices 305 will fail to properly receive the internal control/address signals output from register 304.

One potential solution to this problem is to adjust delay period such that the setup time and hold time become balanced at half the period of the external clock signal. Because the delay period is defined by the sum of the register delay and flight time line delay of L3, it may be changed by modifying either of these two values.

However, the register delay is an intrinsic property of register 304 that can only be changed by physically modifying or reconfiguring register 304. Hence, it is not possible to dynamically change register delay to enable registered memory system 300 to operate at a different frequency. A change in the register delay would necessarily involve the manufacturer of register 304. This proves in practical circumstances to be very difficult since a memory module manufacturer may purchase multiple different registers from different register manufacturers.

The flight time line delay on the other hand may be dynamically changed to adjust delay period. Two conventional approaches to the adjustment of delay period by changing the flight time line delay are disclosed in published U.S. Patent Application No. 2003/0221044 (the '044 application) and U.S. Pat. No. 6,754,112 (the '112 patent). In both the '044 application and the '112 patent, register 304 includes a delay circuit (e.g., a delay-lock loop) that may be reprogrammed to adjust the flight time line delay when the operating frequency of registered memory 300 is changed.

Unfortunately, the inclusion of a reprogrammable delay circuit within register 304 creates at least two problems. First, it increases the manufacturing cost and potentially the size of register 304. Second, it adds another step in the programming process required to change the operating frequency of the constituent registered memory system. This additional step is undesirable because operating frequency selection for a memory system should be as seamless and transparent to the host system as possible.

SUMMARY OF THE INVENTION

Embodiments of the invention recognize that emerging memory systems must be operable with a range of processors within a variety of host systems. This capability requires highly reliable memory system operation at multiple clock frequencies. A change in memory system operating frequency may not degrade the internal signaling dynamics of the memory system or impose additional programming burdens on an incorporating host system.

Accordingly, in one embodiment the invention provides a memory module, comprising a clock generator configured to generate first and second internal clock signals in relation to an external clock signal, and a register configured to receive the first and second internal clock signals, and further configured to store an external control/address signal in response to the first internal clock signal (the "input clock signal"), and transmit an internal control/address signal derived from the external control/address signal in response to the second internal clock signal (the "output clock signal").

In one related aspect, the input and output clock signals may comprise differential clock signals. In another related aspect, the memory module may further comprise a plurality of memory devices configured to receive the internal control/address signal via a signal line having a flight time. In this aspect, the output clock signal may be defined to lead the input clock signal by a delay value defined in relation to the flight time.

In yet another related aspect, the register may receive the input clock signal via a first signal line and the output clock signal via a second signal line, wherein at least one of the first and second signal lines comprises a capacitor adapted to adjust signal flight time.

In another embodiment, the invention provides a memory module, comprising; a clock generator adapted to generate first and second internal clock signals in relation to an external clock signal, a plurality of memory devices configured to receive the first internal clock signal via a first signal line, and a register configured to receive the second clock signal via a second signal line and a third internal clock signal via a third signal line, wherein the register is further configured to store an external control/address signal in response to the third internal clock signal, and transmit an internal control/address signal derived from the external control/address signal to the plurality of memory devices via a fourth signal line in response to the second internal clock signal, and wherein the phase of the second internal clock signal leads the phase of the third internal clock signal by a delay value defined in relation to a flight time of the fourth signal line.

In yet another embodiment, the invention provides a memory system comprising; a chipset generating external control/address signals and an external clock signal, and a plurality of memory modules each receiving the external control/address signals and the external clock signal. Within this arrangement, each one of the plurality of memory modules comprises; a clock generator configured to generate first and second internal clock signals in relation to the external clock signal, and a register configured to receive the first and second internal clock signals and further configured to store the external control/address signal in response to the first internal clock signal, and transmit an internal control/address signal derived from the external control/address signal in response to the second internal clock signal.

In still another embodiment, the invention provides a method of transmitting internal control/address signals from a register to a plurality of memory devices arranged on a memory module. The internal control/address signals are typically derived from received external control/address signals. The method comprises generating an internal clock signal from an external clock signal, transmitting the internal clock signal to the register, forming a delayed internal clock signal and transmitting the delayed internal clock signal to the register storing the external control/address signals in the register in response to the delayed internal clock signal, and transmitting the internal control/address signals from the register to the plurality of memory devices via a control/address signal bus in response to the internal clock signal.

In still another embodiment, the invention provides a method of transmitting internal control/address signals in a memory module, the internal control/address signals being derived from external control/address signals, and the memory module comprising; a clock generating a first internal clock from an external clock signal, a register and a plurality of memory devices, and a control/address signal bus connecting the register to the plurality of memory devices, and characterized by a control/address signal flight time. The method comprises; delaying the first clock signal by a delay value corresponding to the control/address signal flight time to generate a second internal clock signal, storing the external control/address signals in response to the second internal clock signal, and transmitting the internal control/address signals in response to the first internal clock signal.

In still another embodiment, the invention provides a method of defining a data transfer window for internal control/address signals in a memory module. The memory module comprises a clock circuit generating a first internal clock from a variable external clock signal, a register and a plurality of memory devices, and a control/address signal bus connecting the register to the plurality of memory devices and characterized by a control/address signal flight time. The method comprises; delaying the first internal clock signal by a delay value corresponding to the control/address signal flight time to generate a second internal clock signal, storing the external control/address signals in the register in response to the second internal clock signal, and transmitting the internal control/address signals via the control/address signal bus in response to the first internal clock signal, such that the data transfer window comprises equal data set-up and data-hold time periods.

In still another embodiment, the invention provides a method of operating a memory system comprising a chipset providing an external clock signal configured to run alternatively at a first operating frequency and a second operating frequency, and a plurality of memory modules each comprising a register. Within each one of the plurality of memory modules, the method comprises; generating a first internal clock signal from the external clock signal, generating a second internal clock from the first internal clock signal, storing external control/address signals in the register in response to the second internal clock signal, and transmitting internal control/address signals derived from the external control/address signals from the register to a plurality of memory devices during a data transfer window via a control/address signal bus characterized by a signal flight time in response to the first internal clock signal, wherein the data transfer window comprises substantially equal data set-up and data hold time periods whether the external clock signal is operating at the first or second operating frequency.

In still another embodiment, the invention provides a method of operating a memory system comprising a chipset providing an external clock signal configured to run alternatively at a first operating frequency and a second operating frequency, and a plurality of memory modules each comprising a register and a plurality of memory devices. The method comprises; within each one of the plurality of memory modules, generating first, second, and third internal clock signals from the external clock signal, transmitting the first internal clock signal to the plurality of memory devices via a first signal line having a first flight time, transmitting the second internal clock signal to the register via a second signal line having a second flight time, transmitting the third internal clock signal to the register via a third signal line having a third flight time, storing the external control/address signals in the register in response to the third internal clock signal, transmitting internal control/address signals derived from the external control/address signals from the register to the plurality of memory devices during a data transfer window via a fourth signal line having a fourth flight time in response to the second internal clock signal, wherein the data transfer window comprises substantially equal data set-up and data hold time periods whether the external clock signal is operating at the first or second operating frequency.

BRIEF DESCRIPTION OF THE DRAWINGS

The invention is described in relation to several exemplary embodiments illustrated in the accompanying drawings. Throughout the drawings, like reference numbers indicate like exemplary elements, components, or steps. In the drawings

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Among other aspects, the exemplary embodiments of the invention described below illustrate memory systems including registered memory modules. These memory systems control the timing of the registered memory modules (hereafter, memory modules) with an external clock signal. However, in contrast to conventional memory modules, the memory modules described below allow the frequency of the external clock signal to be changed without having to replace or reprogram one or more internal registers on the memory modules adapted to control the delay the provision of control/address signals to constituent memory devices.

Each memory module typically comprises an internal clock generator configured to generate a plurality of internal clock signals in relation to the external clock signal received from an associated chipset. This internal clock generator may be variously implemented using conventionally understood circuits. For example, a Phase-Lock Loop (PLL) circuit, a Delay-Lock Loop (DLL) circuit, or a clock buffer circuit may be used to generate the internal clock signals.

Each memory module also typically comprises a register configured to receive at least one of the plurality of internal clock signals. The register is further configured to receive the external control/address signals and provide the internal control/address signals to a plurality of memory devices in accordance with timing dynamics controlled by one or more of the internal clock signals. As previously noted, the external clock signal and/or any one of the internal clock signals may comprise a differential pair of clock signals, such as those conventionally used in high-speed differential signaling.

Figure 1:
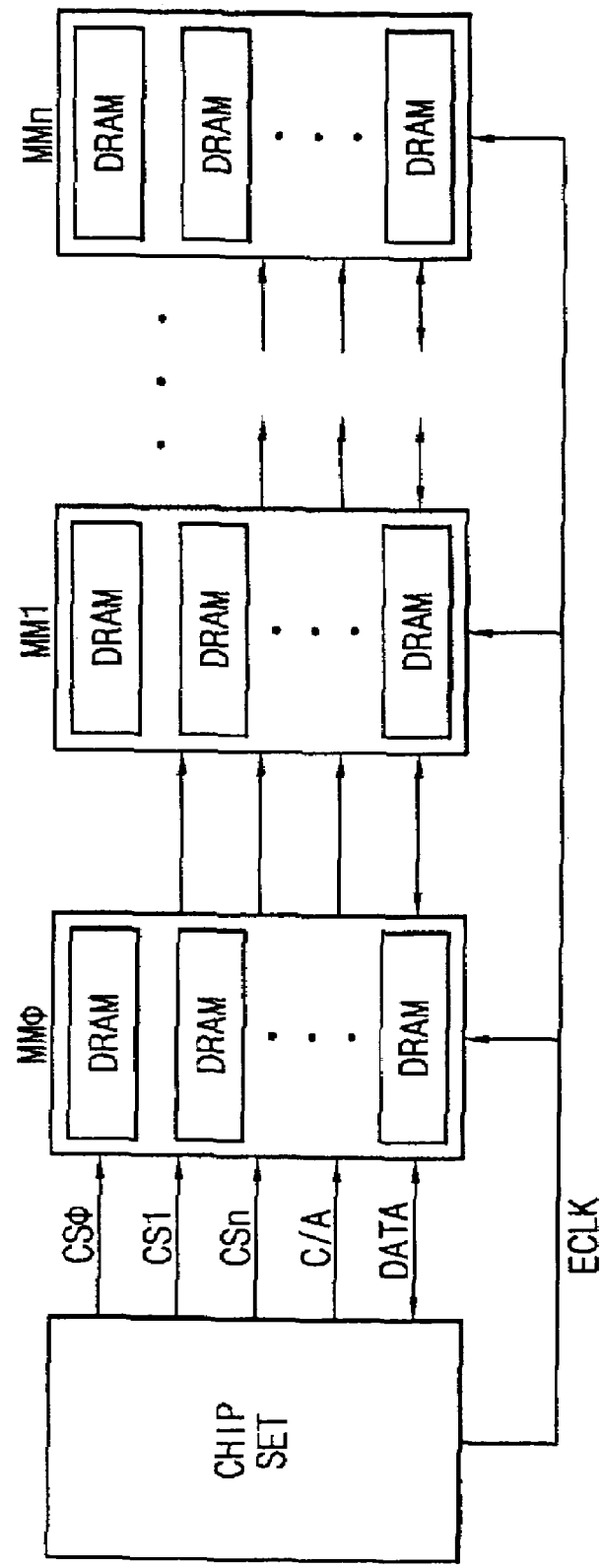
FIG. 1 is a diagram of a conventional arrangement of memory modules on a motherboard with a corresponding chipset.
Figure 2:
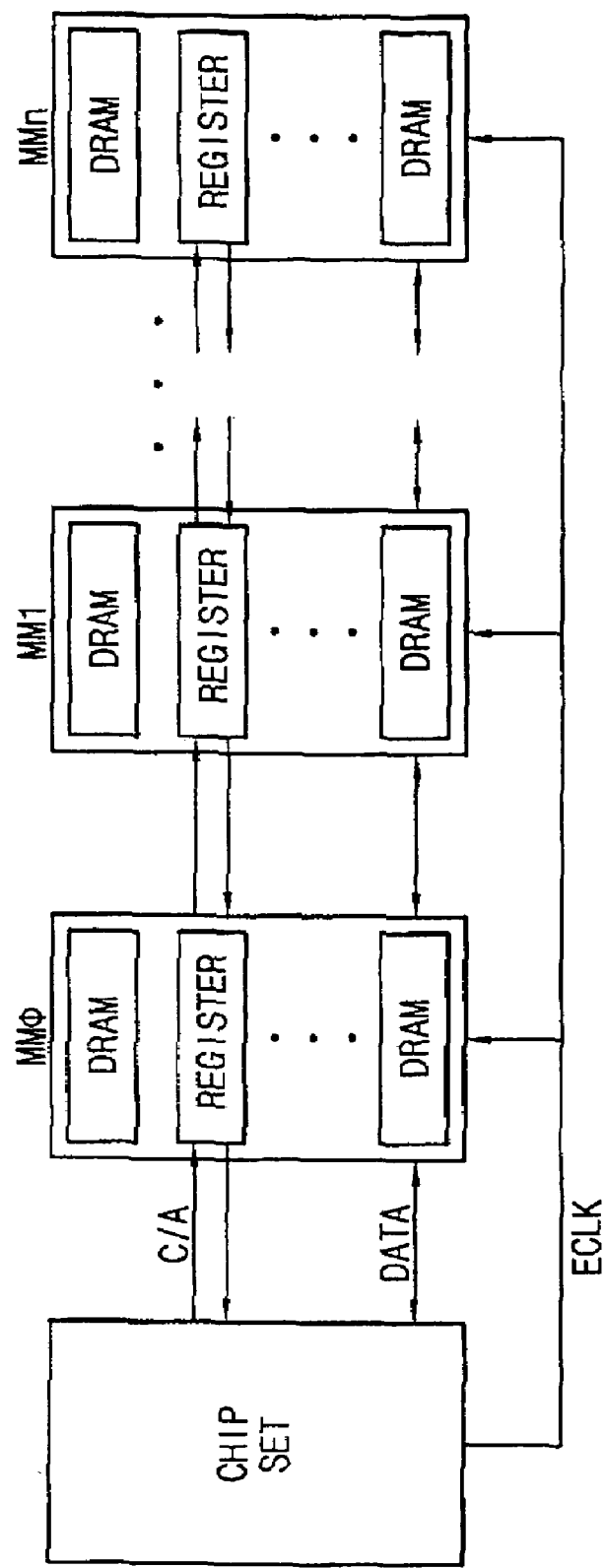
FIG. 2 is a diagram of a conventional arrangement of registered memory modules on a motherboard with a corresponding chipset.
Figure 3:
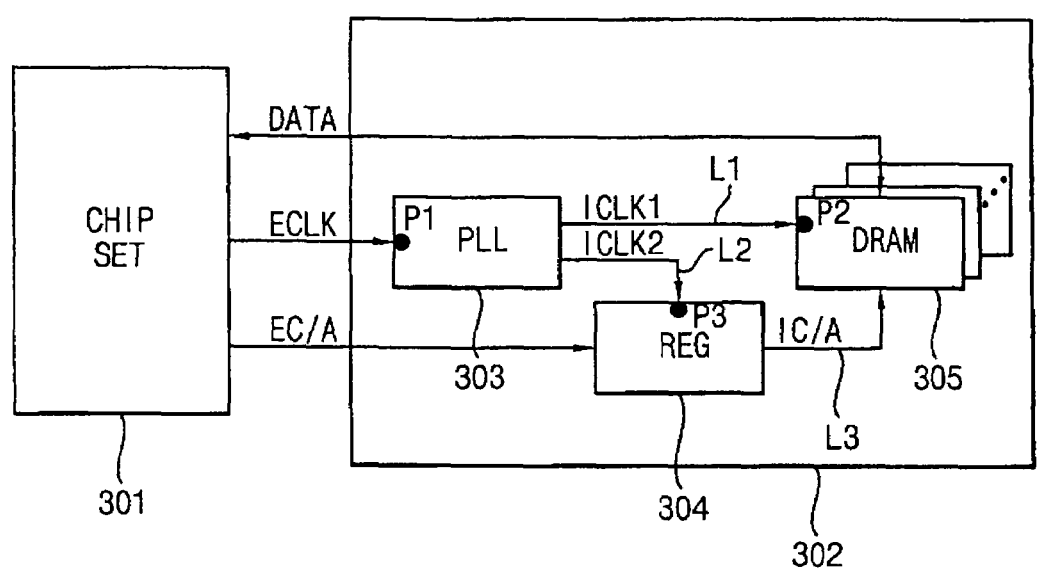
FIG. 3 is a diagram of a conventional registered memory module.
Figure 4:
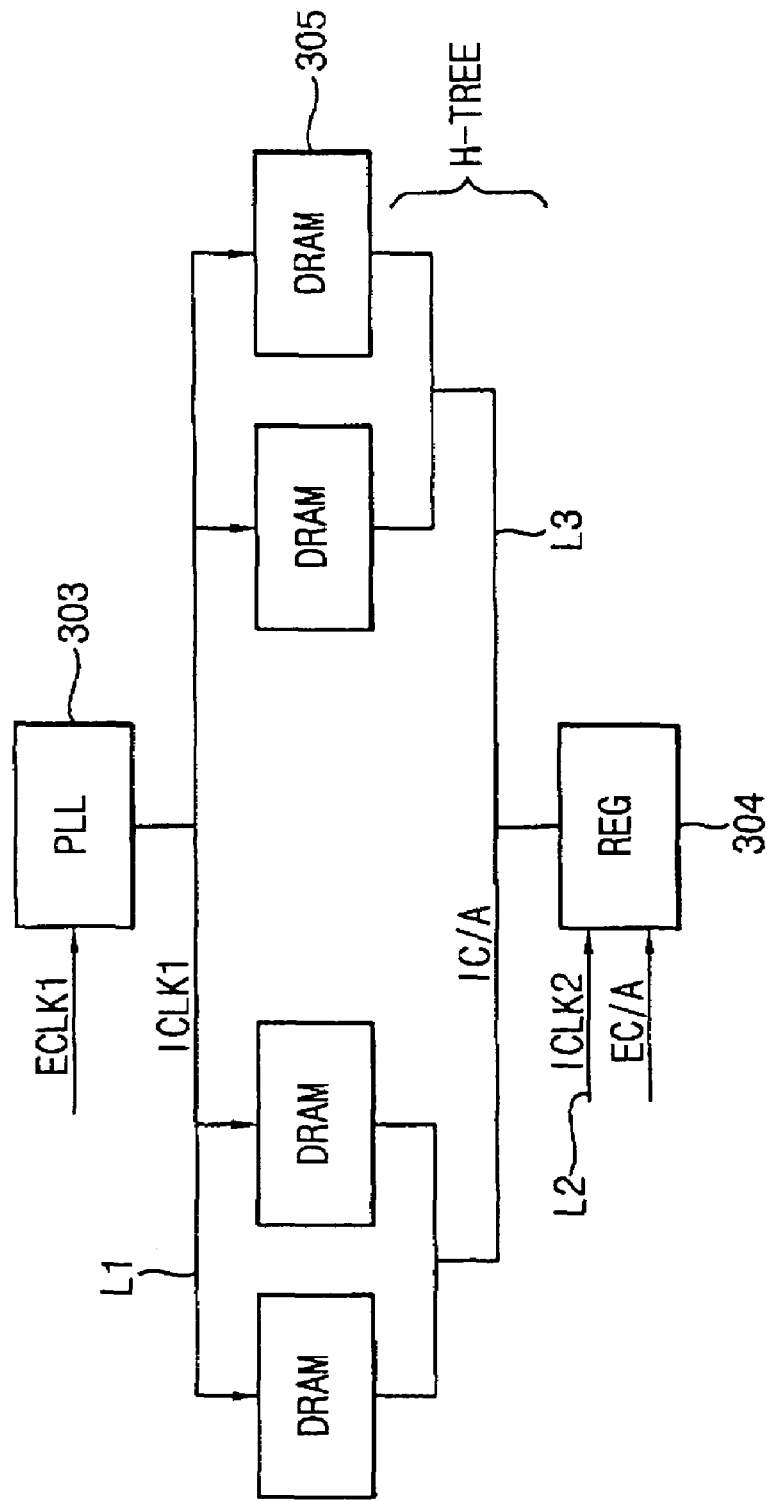
FIG. 4 is a diagram of a conventional registered memory module having a plurality of Memory devices receiving a control address signal through lines configured in a H-tree topology.
Figure 5:
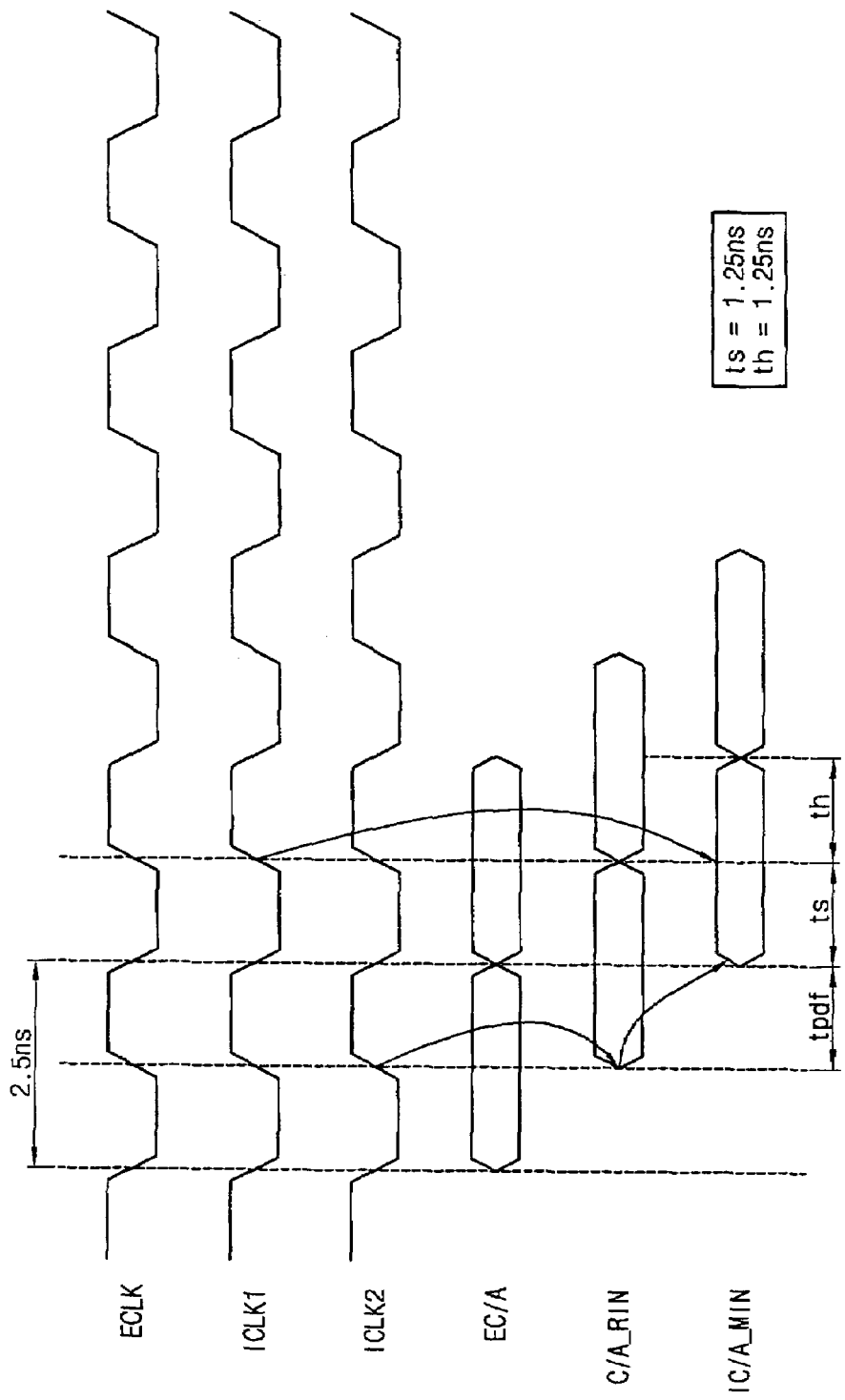
FIG. 5 is a waveform timing diagram illustrating the operation of the conventional registered memory module shown in FIG. 4 at a frequency of 400 MHz.
Figure 6:
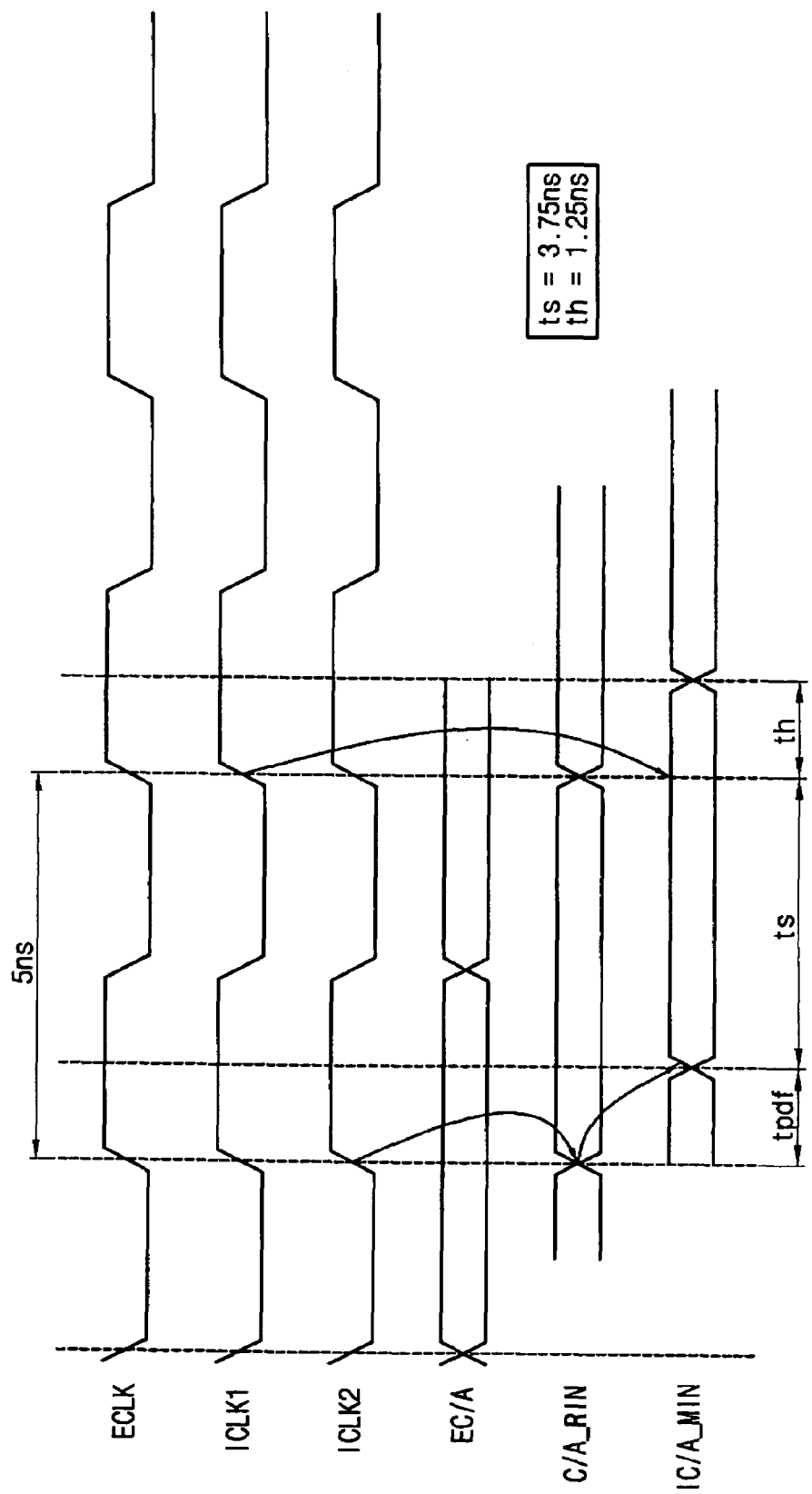
FIG. 6 is a waveform timing diagram illustrating the operation of the conventional registered memory module shown in FIG. 4 at a frequency of 200 MHz.
Figure 7:
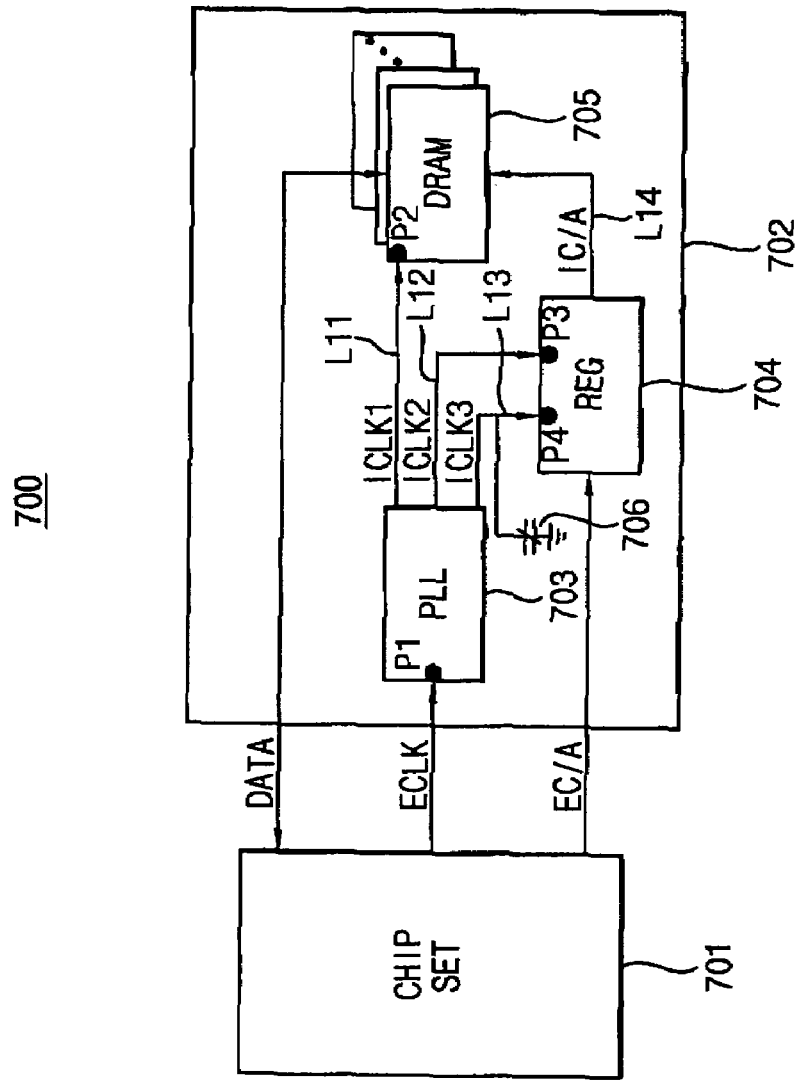
FIG. 7 is a diagram of a registered memory module and accompanying chipset according to an embodiment of the present invention.

Consider, for example, the memory system 700 shown in FIG. 7 as one embodiment of the present invention. For the sake of clarity, memory system 700 is illustrated with one memory module 702 connected to chipset 701. Memory module 702 comprises a clock generator 703, a register 704, and a plurality of memory devices 705. As in the conventional registered memory module, memory module 702 receives an external clock signal (ECLK) and external control/address signals (EC/A) from chipset 701. In addition, memory module 702 transfers DATA to/from chipset 701 via a data bus.

In the illustrated embodiment, clock generator 703 receives the external clock signal and generates (e.g., derives) first, second and/or third internal clock signals (ICLK1, ICLK2, and ICLK3) in relation to external clock signal ECLK. This derivation or generation of internal clock signals (e.g., input and output clock signals) may be accomplished through the use of additional conventional components and elements associated with clock generator 703. At a minimum, clock generator 703 generally comprises a circuit adapted to synchronize first, second and third internal clock signals with the external clock signal. For example, the embodiment shown in FIG. 7 assumes that clock generator 703 comprises at least a phase-lock loop (PLL) circuit.

In the illustrated embodiment, the external clock signal has the same phase as the first and second internal clock signals when sampled, respectively, at points P1, P2, and P3. However, the phase of the third internal clock signal, as sampled at point P4, is ahead of (i.e., leads) the external clock signal. As a result, the third internal clock signal also leads first and second internal clock signals and by a similar phase (or delay) relationship. (As the clock signals used in the description of the exemplary embodiments are all assumed to be regularly periodic, those of ordinary skill in the art will understand that a relative phase difference (lead and lag) may be developed between different clock signals by introducing or maintaining a "delay" between the different clock signals. Hence, one clock signal may be adjusted to accurately lead another, formerly synchronous, clock signal by the calculated introduction of a defined delay into one or both of the clock signals).

Register 704 receives the second and third internal clock signals and the external control/address signals, and provides the internal control/address signals to memory devices 705. In one instance, the internal control/address signals are provided as nothing more than latched or buffered (e.g., stored or subsequently provided) versions of the external control/address signals by register 704. In another instance, the external control/address signals are frequency and/or signal threshold conditioned by register 704 before being provided as internal control/address signals to the memory devices 705. In either of these specific instances, as well as many other instances readily apparent to those of ordinary skill in the art, the internal control/address signals are said to be "derived" from the external control/address signals.

In the example shown in FIG. 7, register 704 uses the second and third internal clock signals to control the derivation of the internal control/address signals from the external control/address signals. As generally described above, the external and internal control/address signals contain one or more control signals and/or one or more address signals of the type conventionally applied to memory devices (e.g., DRAM, SDRAM, SRAM, etc.) in order to access data. For example, the external and internal control/address signals may indicate that a read or a write operation is to be performed, and/or provide an address from/to which data is to be read/written.

Memory devices 705 receive the internal control/address signals and the first clock signal, and transfer data to/from chipset 701 according to these received signals. For example, memory devices 705 may sample the internal control/address signals from register 704 and transfer the data at intervals defined by the first internal clock signal.

The first internal clock signal is transferred from clock generator 703 to memory devices 705 via a first signal line L11. The second and third internal clock signals are transferred from clock generator 703 to register 704 via respective signal lines L12 and L13. The actual nature and type of these "signal lines" will vary with memory system design and the definition of related signals to be transferred. For example, one or more of signal lines L11, L12 and L13 may comprise dual differential signal lines.

However implemented, the first, second and third signal lines are characterized in the illustrated embodiment by signal propagation delays (i.e., signal flight times) respectively denoted as "d1", "d2", and "d3". The internal control/address signals are transferred to memory devices 705 via signal line L14 having a signal propagation delay "d4". In many practical implementations of the illustrated embodiment, the "signal line" L14 will comprise a signal line bus carrying a plurality of address and/or control signals. In such instances, the signal propagation delay "d4" may be group approximation of the actual propagation delays for individual signal lines forming signal line L14.

In the illustrated embodiment, an adjustable capacitor 706 is associated with signal line L13 (e.g., connected between signal line L13 and ground) in order to adjust the signal propagation delay "d3" (i.e., adjust the signal flight time on signal line L13). An adjustable capacitor is just one example of a number of "delay circuits" that may be associated with signal line L13 and/or signal line L12 in order to modify the relative phase characteristics of the second and third internal clock signals (e.g., control delays "d2" and/or "d3").

Figure 8:
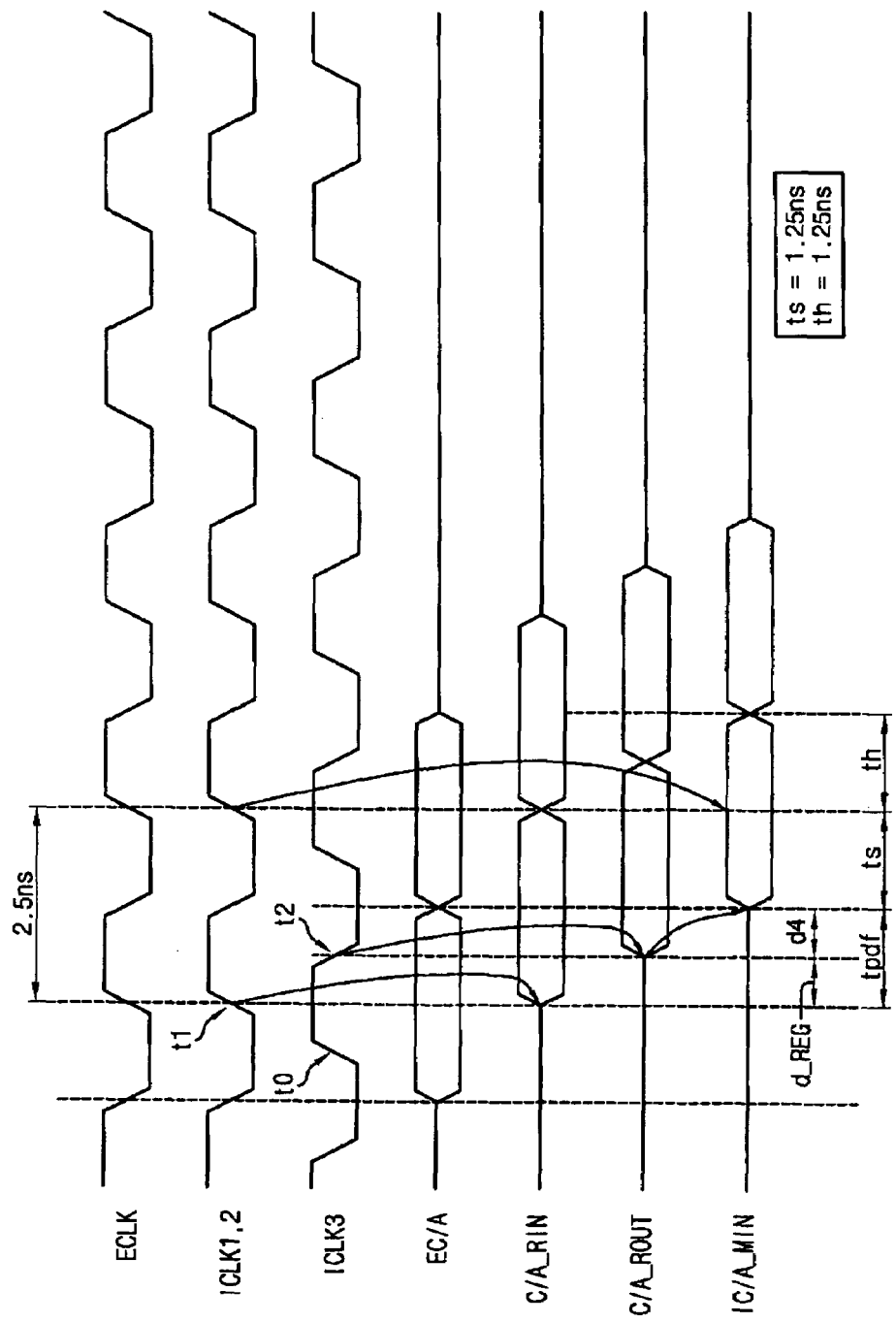
FIG. 8 is a waveform timing diagram illustrating the operation of the registered memory module shown in FIG. 7 at a frequency of 400 MHz.

In order for memory module 702 to operate reliably, the timing of the internal control/address signals should be coordinated in relation to at least one of the internal clock signals (e.g., the first clock signal). FIG. 8 is a waveform timing diagram illustrating the operation of the exemplary memory module 702 of FIG. 7. In FIG. 8, memory module 702 is assumed to be operating within a memory system at a frequency of 400 MHz.

Referring to FIG. 8, delays "d1", "d2", "d3", and "d4" are respectively established at 0.7 ns, 0.7 ns, 0.2 ns, an 0.5 ns. The external control/address signals are stored in register 704 as register input signal C/A_Rin on the rising edge of the second internal clock signal (ICLK2). Accordingly, the second internal clock signal may be designated in this particular embodiment as a "register input clock signal". Register input signal (C/A_Rin) is output from register 704 on signal line L14 as a register output signal (C/A_Rout) on the falling edge of the third internal clock signal (ICLK3). Thus, the third internal clock signal may be designated in this particular embodiment as a "register output clock signal".

The register delay (d_REG) associated with register 704 may be defined as the interval between the rising edge of the second internal clock signal and the subsequent falling edge of the third internal clock signal. After being delayed by the combination of the register delay (d_REG) and the signal propagation delay "d4" associated with signal line L14, the register output signal (C/A_Rout) is input to memory devices 705, for example, as a memory bank input signal (i.e., internal control/address signals IC/A_Min).

By setting delay "d3" such that register output signal (C/A_Rout) is input to memory devices 705 a half a clock cycle before the rising edge of the first internal clock signal, setup (ts) and hold (th) times for the memory bank input signal (IC/A_Min) will both be equal to half the period of the external clock signal, or 1.25 ns. Accordingly, memory devices 705 are able to reliably sample the internal control/address signal.

In the embodiment shown in FIG. 7, the setup and hold times for the internal control/address signal may effectively be set to half the period of external clock signal by defining delay "d3" to be equal to either delay "d1" or "d2" (these are equal in the illustrated example) minus delay "d4", (e.g., "d3"=("d1 or "d2")−"d4"). For example, using the delay assumptions described in relation to the example illustrated in FIGS. 7 and 8, delay "d3" is equal to "d1" (0.7 ns) minus "d4" (0.5 ns), or 0.2 ns. To further illustrate this point in relation to FIG. 8, let $t_0$ denote the rising edge of the third internal clock signal, let $t_1$ denote the rising edge of the first internal clock signal, and let $t_2$ denote the falling edge of the third internal clock signal after $t_1$. Furthermore, let "P" denote the period of the external clock signal as well as at least the first internal clock signal of the illustrated example.

According to foregoing illustrative definitions, the rising edge of the first internal clock signal occurs after the rising edge of the third internal clock signal by a delay value defined by the equation $t_1 = t_1 + (d1-d3)$. The falling edge of the third internal clock signal occurs one half a period after the rising edge of the same signal according to the equation $t_2 = t_0 + \frac{1}{2}(P)$. Accordingly, the register delay (d_REG) between the rising edge of the first internal clock signal and the third internal clock signal may be represented by the equation $d\_REG = t_2 - t_1$. After making substitutions, $d\_REG = t_0 + \frac{1}{2}(P) - t_0 - (d1-d3) = \frac{1}{2}(P) - d1 + d3$. By inserting d3=d1−d4 into the previous equation, we get $d\_REG = \frac{1}{2}(P) - d1 + d1 - d4$, or $d\_REG + d4 = \frac{1}{2}(P)$. Accordingly, the definition of d3=d1−d4 results a data transition of the internal control/address signals (IC/A_Min) at half a period following the rising edge of the first internal clock signal. As a result, both setup (ts) and hold (th) times for internal control/address signals transmitted to the memory devices 705 are set to one half the period of external clock signal (or the corresponding first internal clock signal in the illustrated example).

Figure 9:
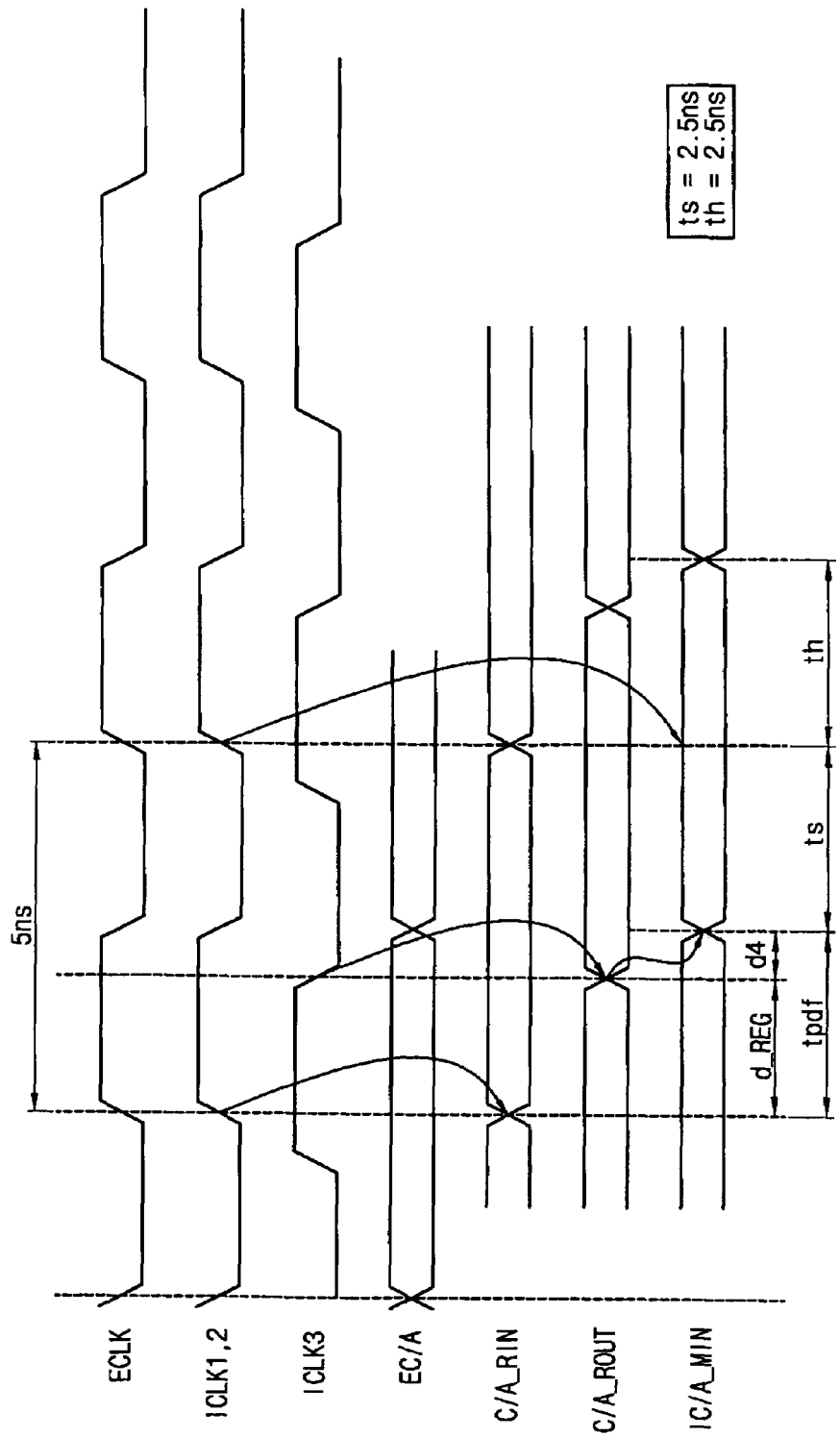
FIG. 9 is a waveform timing diagram illustrating the operation of the registered memory module shown in FIG. 7 at a frequency of 200 MHz.

FIG. 9 is an analogous waveform timing diagram illustrating the operation of the exemplary memory module 702 shown in FIG. 7 at a frequency of 200 MHz (or one half the operating frequency of the former example described in relation to FIG. 8). In FIG. 9, delays "d1" through "d4" are assumed for the sake of simple comparison to be the same as those described in relation to FIG. 8. However, from the foregoing, the register delay (d_REG) will vary according to the equation $d\_REG = \frac{1}{2}(P) - d4$. Accordingly, even though the operating frequency of the exemplary memory module has been changed, the setup and hold times associated with the internal control/address signals remain balanced at half the period of external (or first internal) clock signal.

Figure 10:
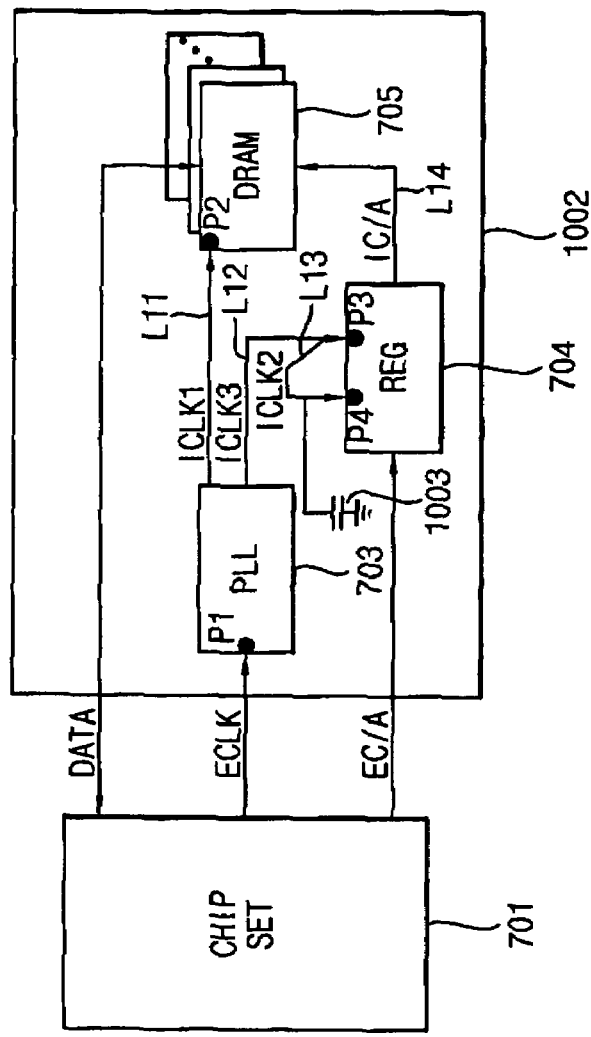
FIG. 10 is a diagram of a registered memory module and accompanying chipset according to another embodiment of the present invention.

FIG. 10 is a circuit diagram illustrating a memory system 1000 comprising a memory module 1002 and an associated chipset 701 according to another embodiment of the invention. Referring to FIG. 10, memory module 1002 is similar to memory module 702 except that a separate third internal clock signal is not produced by clock generator 703. Instead, a third internal clock signal (ICLK3) is derived from the second internal clock signal (ICLK2). For example, as shown in FIG. 10, a third signal line L13 may be connected between the second signal line L12, as applied to a first clock signal input (P4) of register 704, and a second clock signal input (P3). A delay circuit (e.g., 1003) may be associated with the second signal line L12 and/or the third clock signal L13.

Figure 11:
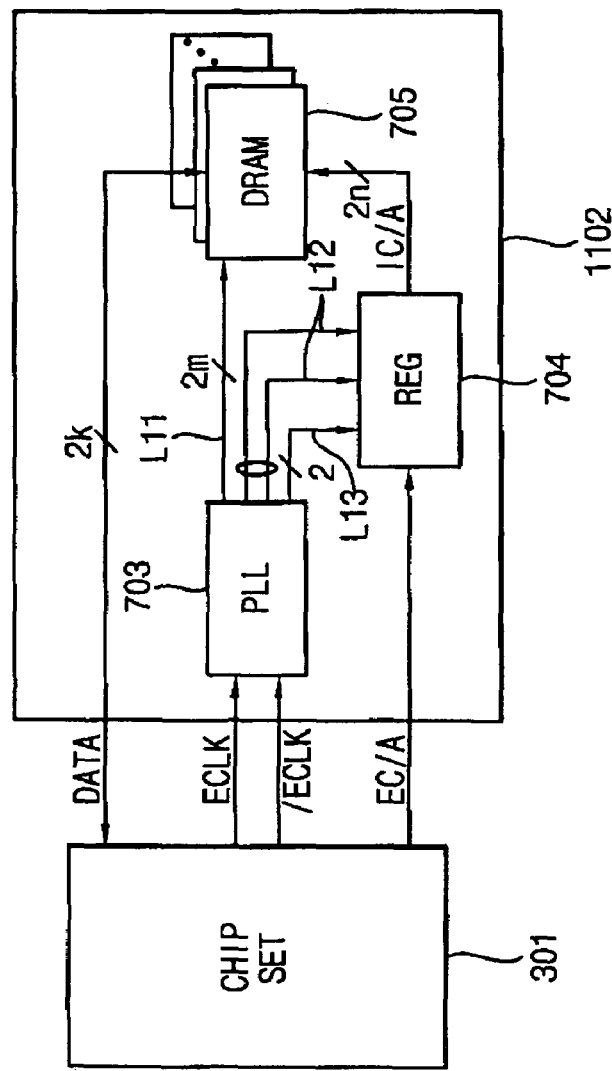
FIG. 11 is a diagram of a registered memory module and accompanying chipset according to still another embodiment of the present invention; and, FIG. 12 is a flowchart illustrating an exemplary method of transmitting internal control/address signals from a register to a plurality of memory devices arranged in a memory module.

FIG. 11 is a circuit diagram of a memory system 1100 comprising a memory module 1102 according to yet another embodiment of the present invention. Referring to FIG. 11, memory module 1102 is similar to memory module 702 shown in FIG. 7, except that all signal lines in memory module 1102 comprise differential signal pairs. For instance, external clock signal (ECLK) is shown as an differential (e.g., paired) external clock signal carried on a pair of differential clock signal lines. Similarly, signal line L11 is shown as "m" pairs of differential clock signal lines carrying "m" paired internal clock signals, where "m" is the number of memory devices in memory devices 705. Signal lines L12 and L13 are also shown as pairs of differential clock signal lines carrying internal paired clock signals. Signal line L14 comprises "n" pairs of differential signal lines, where "n" is a bus width for signal line L14. Finally, the data line connecting chipset 701 to memory devices 705 comprises "k" differential signal lines carrying "k" paired data signals, where "k" is the bus width of the data line. A delay circuit may be associated with the signal lines pairs transmitting the differentially provided second and/or third internal clock signals. For example, a capacitor may be introduced between line pairs to adjust phase characteristics and/or reduce noise.

Figure 12:
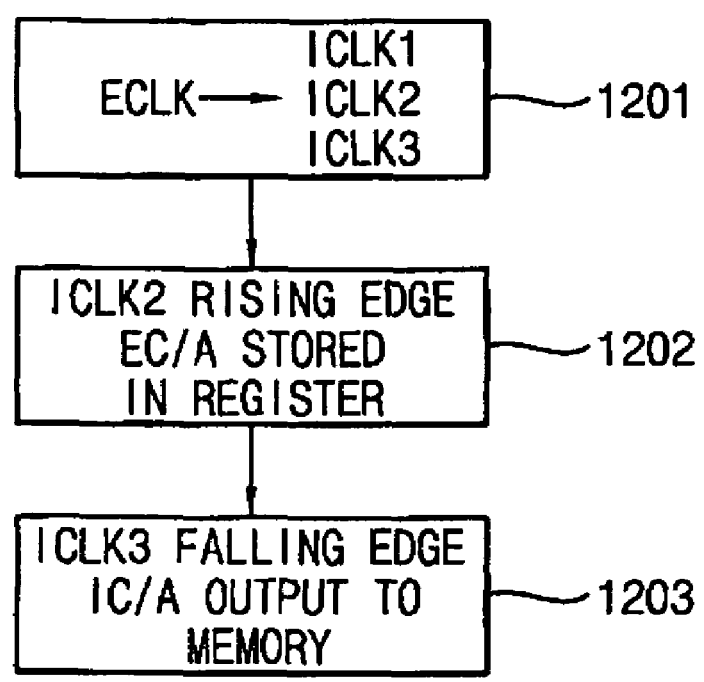

FIG. 12 is a flowchart illustrating an exemplary method of transmitting internal control/address signals from a register to a plurality of memory devices arranged in a memory module. In the method of FIG. 12, the internal control/address signals (IC/A) are derived from external control/address signals (E/CA). A plurality of internal clock signals (e.g., first, second and third internal clock signals ICLK1, ICLK2, and ICLK3, or first and second internal clocks ICLK1 and ICLK2) are generated (e.g., derived) from external clock signal ECLK (1201). This is typically accomplished by a clock generator such as a PLL located on the memory module.

A rising or falling edge of one of the plurality of internal clock signals serves to control the storing (e.g., latching) of the external control/address signals into the register (1202). A rising or falling edge of another internally generated clock signal serves to control the output of the internal control/address signals from the register to the memory devices (1203).

In relation to the foregoing method, as with the exemplary memory systems and memory modules previously described, either a rising or a falling clock edge may be used to transfer data or initiate a circuit operation. The illustrated choices of rising and falling clock edge use are merely selected examples, and those of ordinary skill in the art will understand that the specific design of the clock signal(s) (e.g., period, frequency, edge definition, etc.) is another choice left to the memory system designer.

In the foregoing method, as with the exemplary memory systems and memory modules previously described, the internal clock signals may be defined or adjusted in view of relevant signal line flight times to provide a desired phase relationship between one internal clock signal gating the input of external control/address signals to the register, and another internal clock signal (e.g., a delayed version of the former clock signal) gating the output of the internal control/address signals derived from the external control/address signal.

As noted at several points within this description, the foregoing embodiments are merely examples teaching the making and use of the invention. Those of ordinary skill in the art will understand that various changes modifications and alterations in form and detail may be made to the exemplary embodiments without departing from the scope of the present invention which is defined by the following claims.

What is claimed is:

1. A memory module, comprising:
   a clock generator configured to generate first and second internal clock signals in relation to an external clock signal; and,
   a register configured to receive the first and second internal clock signals, and further configured to store an external control/address signal in response to the first internal clock signal (the "input clock signal"), and transmit an internal control/address signal derived from the external control/address signal in response to the second internal clock signal (the "output clock signal").

2. The memory module of claim 1, wherein the input and output clock signals respectively comprise differential clock signals.

3. The memory module of claim 1, further comprising:
   a plurality of memory devices configured to receive the internal control/address signal via a signal line having a flight time;
   wherein the output clock signal leads the input clock signal by a delay value defined in relation to the flight time.

4. The memory module of claim 3, wherein the internal control/address signal comprises a plurality of address or control signals, and wherein the signal line comprises a signal line bus.

5. The memory module of claim 3, wherein the register receives the input clock signal via a first signal line and the output clock signal via a second signal line;
   wherein at least one of the first and second signal lines comprises a capacitor adapted to adjust signal flight time.

6. The memory module of claim 5, wherein the input clock signal comprises first differential internal clock signals, and wherein the output clock signal comprises second differential internal clock signals.

7. A memory module, comprising:
   a clock generator adapted to generate first and second internal clock signals in relation to an external clock signal;
   a plurality of memory devices configured to receive the first internal clock signal via a first signal line; and,
   a register configured to receive the second clock signal via a second signal line and a third internal clock signal via a third signal line;
   wherein the register is further configured to store an external control/address signal in response to the third internal clock signal, and transmit an internal control/address signal derived from the external control/address signal to the plurality of memory devices via a fourth signal line in response to the second internal clock signal; and,
   wherein the phase of the second internal clock signal leads the phase of the third internal clock signal by a delay value defined in relation to a flight time of the fourth signal line.

8. The memory module of claim 7, further comprising:
   a delay circuit connected to the second signal line and configured to delay the second internal clock signal by the delay value to generate the third internal clock signal.

9. The memory module of claim 8, wherein the delay circuit comprises a capacitor connected to the third signal line.

10. The memory module of claim 7, wherein the first, second, third, and fourth signal lines respectively define first, second, third, and fourth flight times; and
    wherein the first and second flight times are substantially equal, and the third flight time is substantially equal to the first or second flight time minus the fourth flight time.

11. The memory module of claim 10, wherein the third signal line extends from the clock generator to the register, or extends from the second signal line to the register.

12. The memory module of claim 7, wherein the external clock signal and the first, second, and third internal clock signals respectively comprise differential clock signals.

13. A memory system comprising:
    a chipset generating external control/address signals and an external clock signal; and,
    a plurality of memory modules each receiving the external control/address signals and the external clock signal;
    wherein each one of the plurality of memory modules comprises:
    a clock generator configured to generate first and second internal clock signals in relation to the external clock signal; and,
    a register configured to receive the first and second internal clock signals and further configured to store the external control/address signal in response to the first internal clock signal, and transmit an internal control/address signal derived from the external control/address signal in response to the second internal clock signal.

14. The memory system of claim 13, wherein the external clock signal, the first internal clock signal, and the second internal clock signal each respectively comprise differential clock signals.

15. The memory system of claim 13, wherein each one of the plurality of memory modules further comprises:
    a plurality of memory devices configured to receive the internal control/address signal via a signal line having a flight time; and, wherein the phase of the second internal clock signal leads the phase of the first internal clock signal by a delay value defined in relation to the flight time.

16. The memory system of claim 13, wherein the internal control/address signal comprises a plurality of address or control signals and wherein the signal line comprises a signal line bus.

17. The memory system of claim 15, wherein the register receives the first internal clock signal via a first signal line and the second internal clock signal via a second signal line; wherein at least one of the first and second signal lines comprises a capacitor adapted to adjust signal flight time.

18. The memory module of claim 17, wherein the external clock signal, the first internal clock signal and the second internal clock signal comprise respective differential clock signals.

19. A method of transmitting internal control/address signals from a register to a plurality of memory devices arranged on a memory module, the internal control/address signals being derived from received external control/address signals, and the method comprising:
  generating an internal clock signal from an external clock signal;
  transmitting the internal clock signal to the register;
  forming a delayed internal clock signal and transmitting the delayed internal clock signal to the register
  storing the external control/address signals in the register in response to the delayed internal clock signal: and,
  transmitting the internal control/address signals from the register to the plurality of memory devices via a control/address signal bus in response to the internal clock signal.

20. The method of claim 19, wherein the phase of the internal clock signal leads the phase of the delayed internal clock signal by a delay value defined in relation to a flight time of the internal control/address signals on the control/address signal bus.

21. The method of claim 19, wherein the internal clock signal and the delayed internal clock signal each comprise a differential signal.

22. The method of claim 19, further comprising:
  transmitting the internal clock signal to the plurality of memory devices via a first signal line having a first flight time; and,
  wherein the internal clock signal is transmitted to the register via a second signal line having a second flight time, the delayed internal clock signal is transmitted to the register via a third signal line having a third flight time, and the control/address signal bus is characterized by a fourth flight time;
  wherein the first and second flight times are substantially equal, and the third flight time is substantially equal to the first or second flight time minus the fourth flight time.

23. The method of claim 22, wherein at least one of the second or third signal lines comprises a delay circuit.

24. A method of transmitting internal control/address signals in a memory module, the internal control/address signals being derived from external control/address signals, and the memory module comprising:
  a clock generating a first internal clock from an external clock signal;
  a register and a plurality of memory devices; and,
  a control/address signal bus connecting the register to the plurality of memory devices, and characterized by a control/address signal flight time; and,
wherein the method comprises:
  delaying the first clock signal by a delay value corresponding to the control/address signal flight time to generate a second internal clock signal;
  storing the external control/address signals in response to the second internal clock signal; and,
  transmitting the internal control/address signals in response to the first internal clock signal.

25. The method of claim 24, wherein the external clock signal and the first and second internal clock signals respectively comprise a differential clock signal.

26. A method of defining a data transfer window for internal control/address signals in a memory module, the memory module comprising:
  a clock circuit generating a first internal clock from a variable external clock signal;
  a register and a plurality of memory devices; and,
  a control/address signal bus connecting the register to the plurality of memory devices and characterized by a control/address signal flight time;
the method comprising:
  delaying the first internal clock signal by a delay value corresponding to the control/address signal flight time to generate a second internal clock signal;
  storing the external control/address signals in the register in response to the second internal clock signal; and,
  transmitting the internal control/address signals via the control/address signal bus in response to the first internal clock signal, such that the data transfer window comprises equal data set-up and data-hold time periods.

27. The method of claim 26, further comprising:
  varying the external clock signal while maintaining the data transfer window for internal control/address signals with substantially equal data set-up and data-hold time periods.

28. The method of claim 27, wherein the external clock signal is a differential clock signal.

29. A method of operating a memory system comprising a chipset providing an external clock signal configured to run alternatively at a first operating frequency and a second operating frequency, and a plurality of memory modules each comprising a register, the method comprising:
  within each one of the plurality of memory modules,
    generating a first internal clock signal from the external clock signal,
    generating a second internal clock from the first internal clock signal;
    storing external control/address signals in the register in response to the second internal clock signal; and,
    transmitting internal control/address signals derived from the external control/address signals from the register to a plurality of memory devices during a data transfer window via a control/address signal bus characterized by a signal flight time in response to the first internal clock signal, wherein the data transfer window comprises substantially equal data set-up and data hold time periods whether the external clock signal is operating at the first or second operating frequency.

30. The method of claim 29, wherein the phase of the first clock signal leads the phase of the second internal clock signal by a delay value defined in relation to the signal flight time.

31. A method of operating a memory system comprising a chipset providing an external clock signal configured to run alternatively at a first operating frequency and a second operating frequency, and a plurality of memory modules each comprising a register and a plurality of memory devices, the method comprising:
within each one of the plurality of memory modules,
generating first, second, and third internal clock signals from the external clock signal,
transmitting the first internal clock signal to the plurality of memory devices via a first signal line having a first flight time;
transmitting the second internal clock signal to the register via a second signal line having a second flight time;
transmitting the third internal clock signal to the register via a third signal line having a third flight time;
storing the external control/address signals in the register in response to the third internal clock signal;
transmitting internal control/address signals derived from the external control/address signals from the register to the plurality of memory devices during a data transfer window via a fourth signal line having a fourth flight time in response to the second internal clock signal, wherein the data transfer window comprises substantially equal data set-up and data hold time periods whether the external clock signal is operating at the first or second operating frequency.

32. The method of claim 31, wherein the second internal clock signal leads the third internal clock signal by a delay value defined in relation to the fourth flight time.

33. The method of claim 31, wherein the first and second flight times are substantially equal, and the third flight time is substantially equal to the first or second flight time minus the fourth flight time.

* * * * *